(12) United States Patent
Knudsen

(10) Patent No.: US 12,261,630 B2
(45) Date of Patent: Mar. 25, 2025

(54) DIFFERENTIAL DELTA-SIGMA MODULATOR FOR A HEARING AID

(71) Applicant: WIDEX A/S, Lynge (DK)

(72) Inventor: Niels Ole Knudsen, Humlebaek (DK)

(73) Assignee: Widex A/S, Lynge (DK)

( * ) Notice: Subject to any disclaimer, the term of this patent is extended or adjusted under 35 U.S.C. 154(b) by 95 days.

(21) Appl. No.: 17/765,688

(22) PCT Filed: Sep. 28, 2020

(86) PCT No.: PCT/EP2020/077080
§ 371 (c)(1),
(2) Date: Mar. 31, 2022

(87) PCT Pub. No.: WO2021/063874
PCT Pub. Date: Apr. 8, 2021

(65) Prior Publication Data
US 2022/0345151 A1   Oct. 27, 2022

Related U.S. Application Data

(60) Provisional application No. 62/910,907, filed on Oct. 4, 2019.

(51) Int. Cl.
*H03M 3/00* (2006.01)
*H03F 3/187* (2006.01)
*H04R 25/00* (2006.01)

(52) U.S. Cl.
CPC .............. *H03M 3/43* (2013.01); *H03F 3/187* (2013.01); *H03M 3/496* (2013.01); *H04R 25/505* (2013.01); *H03F 2200/03* (2013.01)

(58) Field of Classification Search
CPC ....... H04R 25/505; H04R 25/00; H03M 3/43; H03M 3/496; H03M 3/456; H03M 3/458;
(Continued)

(56) References Cited

U.S. PATENT DOCUMENTS 8,299,837 B1   10/2012  Lin
2020/0295777 A1*  9/2020  Onishi ................. H03M 3/494

OTHER PUBLICATIONS

Thomas Christen, "A 15-bit 140-uW Scalable-Bandwidth Inverter-Based Delta Sigma Modulator for a MEMS Microphone With Digital Output", IEEE Journal of Solid-State Circuits, Jul. 1, 2013, pp. 1605-1614, vol. 48, No. 7.

(Continued)

*Primary Examiner* — Tuan D Nguyen
(74) *Attorney, Agent, or Firm* — Sughrue Mion, PLLC

(57) ABSTRACT

A differential delta-sigma-modulator has an integrator including a pair of single-ended amplifiers. A sample clock is driving a first switchable capacitor configuration and a second switchable capacitor configuration at a predetermined switching cycle. The first switchable capacitor configuration is adapted for sampling respective outputs from the pair of single-ended amplifiers on a pair of output sampling capacitors in the first part of the switching cycle. The second switchable capacitor configuration is adapted for charging a common mode capacitor with the average voltage of the voltage sampled by the pair of output sampling capacitors in the second part of the switching cycle. The voltage across the common mode capacitor represents the common mode voltage for the integrator.

19 Claims, 4 Drawing Sheets

(58) Field of Classification Search
CPC ....... H03M 3/356; H03M 3/368; H03F 3/187; H03F 2200/03; H03F 3/2175; H03F 3/45968; H03F 3/45632; H03F 1/26; H03F 2200/372
See application file for complete search history.

(56) References Cited

OTHER PUBLICATIONS

International Search Report for PCT/EP2020/077080 dated Jan. 15, 2021.
Written Opinion for PCT/EP2020/077080 dated Jan. 15, 2021.

\* cited by examiner

DIFFERENTIAL DELTA-SIGMA MODULATOR FOR A HEARING AID

CROSS REFERENCE TO RELATED APPLICATIONS

This application is a National Stage of International Application No. PCT/EP2020/077080 filed Sep. 28, 2020, claiming priority based on U.S. Provisional Patent Application No. 62/910,907 filed Oct. 4, 2019.

The present invention relates to hearing aids. The invention, more particularly, relates to a hearing aid including a differential delta-sigma modulator for providing a digitized signal.

It is desirable to use differential topologies for sensitive analog circuits in complex mixed-mode integrated circuits. The differential topologies are highly immune to noise coupling from adjacent circuitries. This immunity becomes increasingly important with higher demand for integration of more functionalities on the integrated circuits or chips.

However, in power sensitive applications like hearing aids, it can be advantageous to use single ended topologies, as single ended amplifiers for same noise performance generally consume less power compared to differential amplifiers.

The purpose of the invention is to provide a differential delta-sigma modulator having a low power consumption. There is a demand for increasing integration of our audio converters with other circuitries. Easy integration and noise immunity are increasingly important.

This purpose is according to the invention achieved by a differential delta-sigma-modulator comprising a pair of single-ended amplifiers.

The invention will be described in further detail with reference to preferred aspects and the accompanying drawing, in which.

DETAILED DESCRIPTION

Delta-sigma modulation is a method for encoding analog signals into digital signals. In one embodiment of the invention, a delta-sigma modulator is used for converting an analogue input signal into higher-frequency digital signals. According to one embodiment of the invention, a delta-sigma modulator is used for converting an output from a differential microphone into a 1-bit bitstream for further signal processing, e.g. in a hearing aid.

The delta-sigma modulator according to one embodiment of the invention comprises an integrator, a quantizer and a feed-back loop. The number of integrators, and consequently, the numbers of feedback loops, indicates the order of the delta-sigma modulator. In general, first-order modulators are unconditionally stable, while higher-order modulators stability shall be ensured via the actual design.

In an ideal differential circuit, the output signal is represented by a differential voltage (difference), whereas the output common mode (sum) is ideally zero (as the two outputs are equal but have opposite signs). Similarly, the input signal is interpreted as a voltage difference. An ideal differential circuit only responds to voltage differences and ignores common mode voltages.

The advantage of the differential circuit is that external noise affects both outputs equally, so such noise is entered as common mode and not as differential. This means that the differential circuit rejects external noise sources. External disturbances may for example originate from substrate noise, power supply or reference noise.

Common mode amplification will ideally be zero, but for circuits in practice, the common mode amplification may differ from zero. A differential circuit will be balanced, and noise introduced as a common mode voltage on the input does not introduce a differential voltage, why the Common Mode Rejection Ratio (CMRR) is important.

In one embodiment, the common mode amplification is small, in order to ensure that common mode voltage is not amplified from one modulator stage to the following modulator stage or integrator stage and thereby risking saturation of subsequent differential circuitries. In one embodiment, the common mode amplification is one; and in other embodiments the common mode amplification is slightly lower than one, e.g. in the range 0.9-1.

Figure 1:
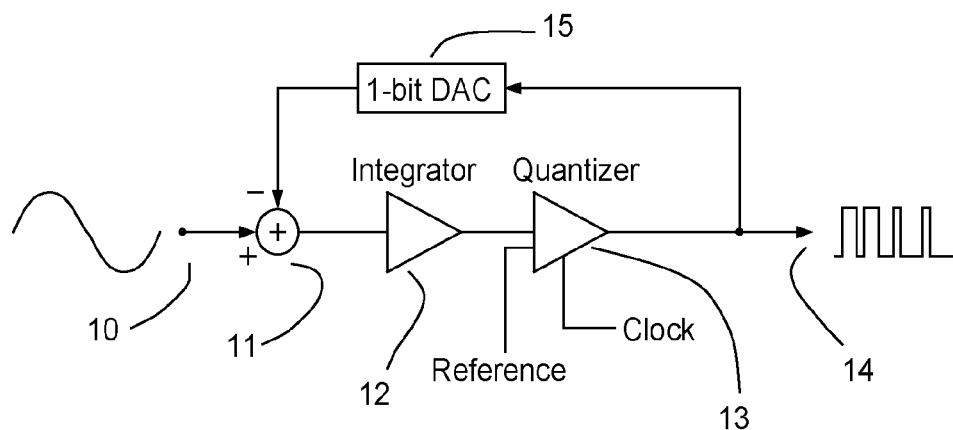
FIG. 1 illustrates the basic principles of a delta-sigma-modulator.

FIG. 1 illustrates the basic principles of a delta-sigma-modulator, e.g. for use in a hearing aid or a hearing assistive device. On an input 10, delta-sigma-modulator receives an analog input signal representing e.g. an audio signal picked up by means of an input transducer like a microphone. The analog input signal is via an adder 11 directed to an integrator 12 integrating the signal received from the adder 11, and further to a quantizer 13 outputting a digitized signal based on the signal received from the adder 11 and integrated in the integrator 12, a reference signal and a clock signal controlling the sample frequency or bit-rate of the output signal. The signal delivered to an output 14 from the quantizer 13 is via a feed-back loop fed back to the adder 11 and subtracted from the analog input signal. The feed-back loop includes a 1-bit digital-to-analog converter 15 ensuring that the feedback signal is presented to the adder 11 as an analog signal. The 1-bit digital-to-analog converter 15 may be replaced by a low-pass filter.

Figure 2:
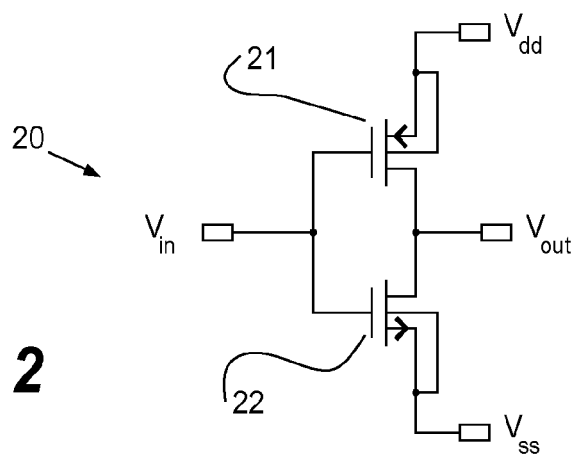
FIG. 2 shows a basic single-stage single-ended amplifier.

FIG. 2 shows a basic single-stage single-ended amplifier 20 having a first p-channel MOSFET transistor 21 and a second n-channel MOSFET transistor 22. The single-stage single-ended amplifier 20 is powered by a positive supply voltage, $V_{dd}$, and a negative supply voltage or ground $V_{ss}$. The input signal supplied to the single-stage single-ended amplifier 20 is received on the input terminal $V_{in}$, and the output provided by the single-stage single-ended amplifier 20 is delivered on the output terminal $V_{out}$.

The single-stage single-ended amplifier 20 shown in FIG. 2 is very power efficient. Furthermore, the single-stage single-ended amplifier 20 exhibits several advantages when a pair of single-stage single-ended amplifiers 20 are used in an integrator stage of a delta-sigma-modulator according to the invention. Both transistors 21 and 22 contribute to transconductance. Therefore, the input referred voltage noise for the combined transistors 21, 22 end up being lower than the noise from each of the individual transistors 21, 22. This is an improvement compared to commonly used differential amplifiers topologies where transistor noise sums up. Furthermore, non-linearities in each individual transistor tends to cancel the opposite transistors non-linearity. The combined characteristic of both transistors is more linear than a single transistor.

Furthermore, the single-stage single-ended amplifier 20 shown in FIG. 2 has excellent input and output properties. The single-stage single-ended amplifier 20 operates as a push-pull amplifier that alternately supplying current to, or absorbing current from, a connected load. A push-pull amplifier is generally very efficient and may achieve high output power. The transconductance increases when the amplifiers input amplitude is large, which reduces settling time. A combined single stage input- and output stage is power efficient compared to topologies with multiple gain stages. In addition, a single stage amplifier is inherently stable in a closed loop. This allows use of the amplifier without frequency compensation and therefor with fast settling. In a differential configuration power supply noise (e.g. on $v_{dd}$) appears as common mode and gets rejected.

According to the invention, the common mode is feed-back from the output to the input for taming the common mode gain. This does not change the important differential properties of the circuit. This will be explained in detail below.

Figure 3:
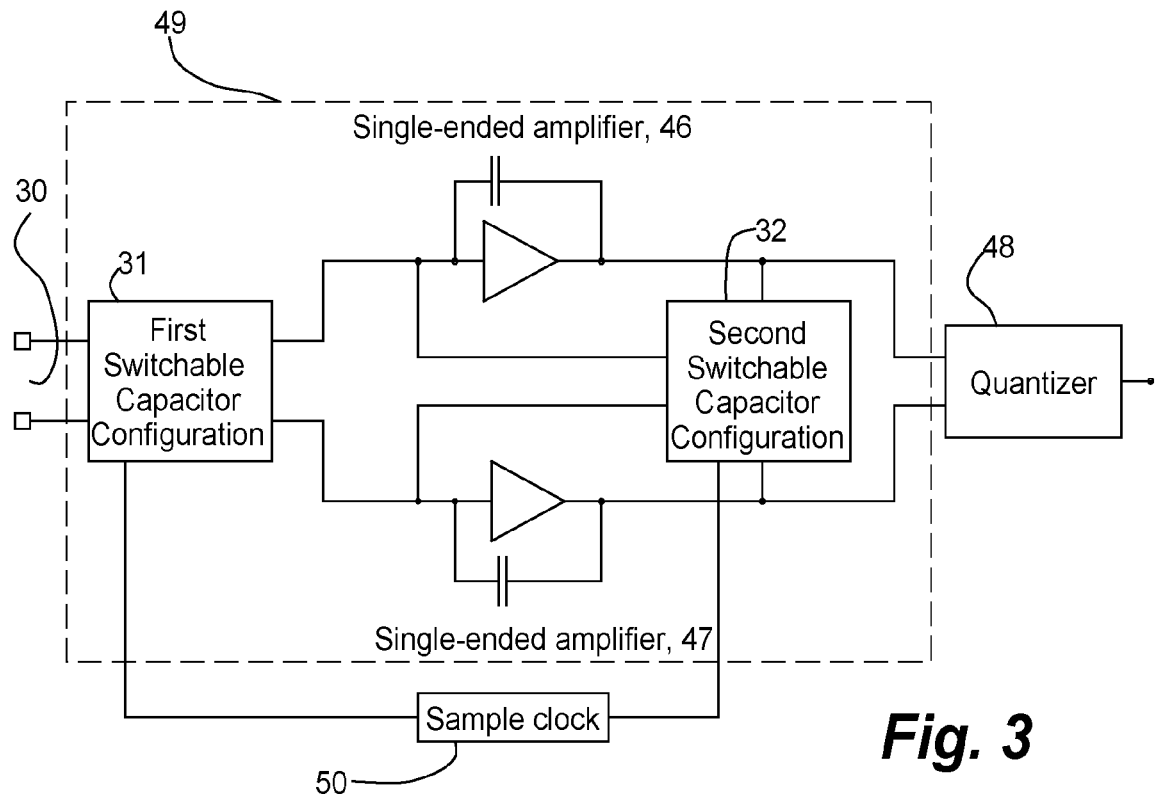
FIG. 3 illustrates schematically one embodiment of a differential delta-sigma-modulator according to the invention.

FIG. 3 illustrates schematically one embodiment of a differential delta-sigma-modulator according to the invention. The differential delta-sigma-modulator has two differential input terminals 30 and an integrator 49 including a pair of single-ended amplifiers 46, 47. The integrator 49 has a first switchable capacitor configuration 31 provided between the two differential input terminals 30 and the input of the pair of single-ended amplifiers 46, 47; and a second switchable capacitor configuration 32 provided between inputs and outputs of respective pair of single-ended amplifiers 46, 47. A sample clock 50 is used for driving the two switchable capacitor configuration 31, 32 at a predetermined switching cycle. In one embodiment, the sample clock 50 provides a sampling cycle consisting of two non-overlapping parts or periods P1, P2.

Figure 4:
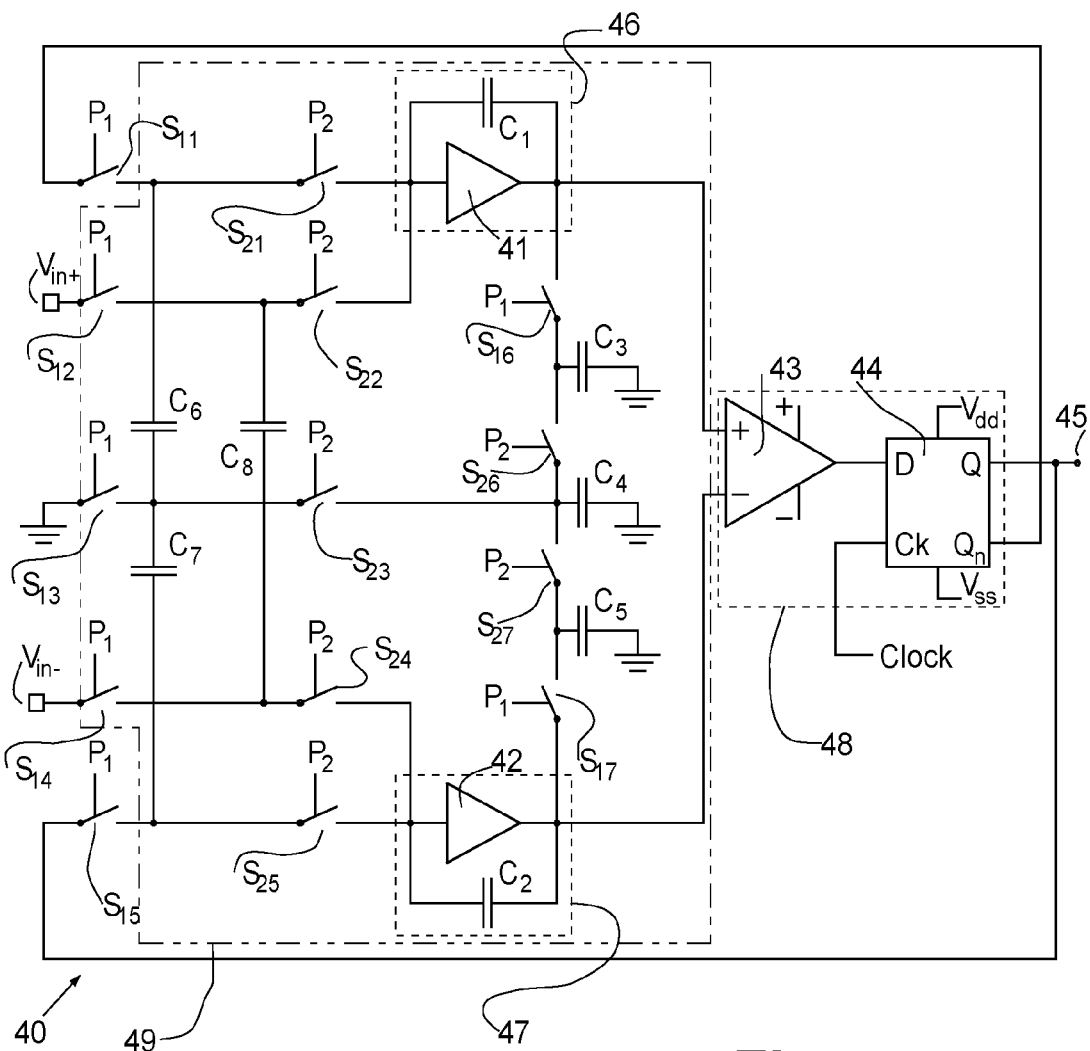
FIG. 4 illustrates one embodiment of a differential delta-sigma modulator according to the invention.
Figure 5A:
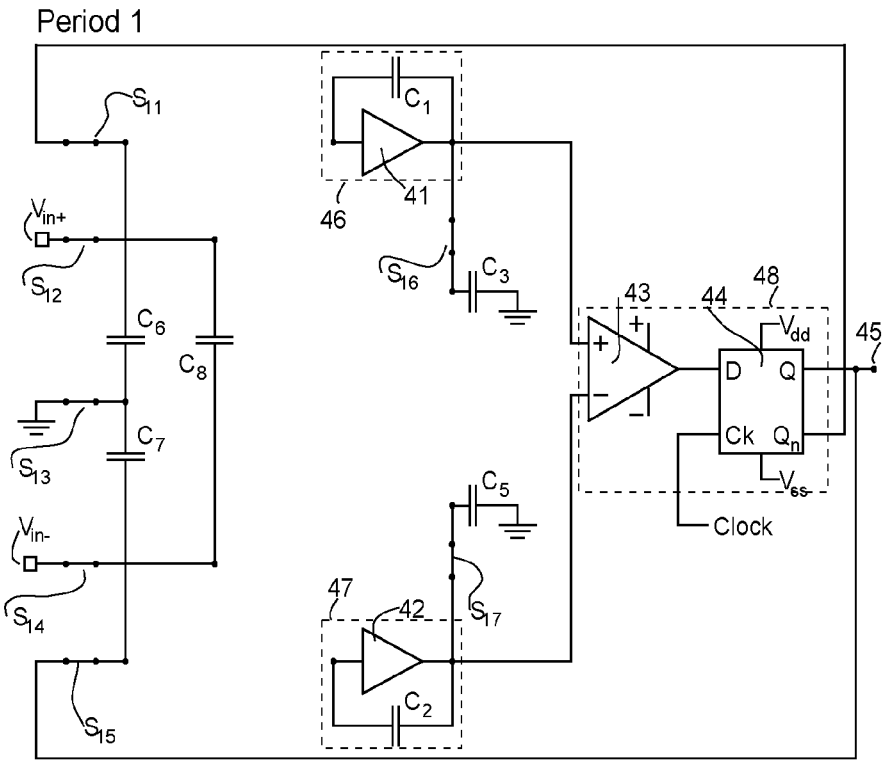
FIGS. 5a and 5b illustrates the differential delta-sigma modulator shown in FIG. 4 in respective one of the two non-overlapping periods of the sampling cycle.

In one embodiment, the second switchable capacitor configuration 32 samples, in a first part of the switching cycle $P_1$, the output from the pair of single-ended amplifiers 46, 47 by means of a pair of capacitors $C_3$, $C_5$ (FIGS. 4 and 5a). The second switchable capacitor configuration 32 is in a second part $P_2$ of the switching cycle adapted for charging a capacitor $C_4$ with the average of the voltage sampled by the pair of capacitors $C_3$, $C_5$. The voltage across the capacitor $C_4$ represents the common mode voltage for the integrator 49. In one embodiment, the second switchable capacitor configuration 32 provides, in a second part $P_2$ of the switching cycle, a feed-back path via a pair of capacitors $C_6$, $C_7$ to a respective input of the two single-ended amplifiers 46, 47.

In one embodiment, the first switchable capacitor configuration 31 samples, in a first part of the switching cycle $P_1$, the input from the pair of differential input terminals 30 by means of a capacitor $C_8$. The first switchable capacitor configuration 31 provides, in a second part $P_2$ of the switching cycle, a feed through path for the sampled input value on the capacitor $C_8$ to respective inputs of the pair of single-ended amplifiers 46, 47.

In one embodiment, the differential delta-sigma-modulator further comprises a comparator or a quantizer 48 comparing the output from the pair of single-ended amplifiers 46, 47 and outputting a logical level in accordance to the comparison. The two of capacitors $C_6$, $C_7$ (FIGS. 4 and 5a) samples, in first part of the switching cycle $P_1$, an output signal from the comparator 48. The first switchable capacitor configuration 31 connects, in a second part $P_2$ of the switching cycle, the pair of capacitors $C_6$, $C_7$ to respective inputs of the pair of single-ended amplifiers 46, 47.

Referring to FIG. 4, a differential delta-sigma modulator 40 according to one embodiment of the invention is shown. The differential delta-sigma modulator 40 has a differential input, $V_{in+}$ and $V_{in-}$, followed by a differential integrator 49 marked in dotted lines and being based on the two single-ended amplifiers 46 and 47.

The first single-ended amplifier 46 is formed by a first inverting amplifier 41 and a capacitor $C_1$, and the second single-ended amplifier 47 is formed by a second inverting amplifier 42 and a capacitor $C_2$. The output from the two single-ended amplifiers 46, 47 is fed to the input of a differential amplifier 43, whose single-ended output is received at the D-input of a flip-flop 44. Together, the differential amplifier 43 and the flip-flop 44 form a quantizer 48. The Q-output from the flip-flop 44 provided an output 45 of the delta-sigma modulator. The Q-output and the inverted Q-output from the flip-flop 44 is fed back to the input of respective single-ended amplifiers 46, 47 via respective feedback paths.

In the embodiment shown in FIG. 4, the differential delta-sigma modulator 40 according to the invention includes a plurality of switches $S_{11}$-$S_{17}$ and $S_{21}$-$S_{27}$. The switches $S_{11}$-$S_{17}$ and $S_{21}$-$S_{27}$ operate at sampling frequency. A sampling cycle consists of two non-overlapping periods denoted $P_1$ and $P_2$. The switches $S_{11}$-$S_{17}$ are activated (closed) in the $P_1$-period, and thereafter deactivated (open) in the $P_2$-period. The switches $S_{21}$-$S_{27}$ are deactivated (open) in the $P_1$-period, and thereafter activated (closed) in the $P_2$-period.

The two switches S11 and S15 belongs to the feed-back loop of the differential delta-sigma modulator 40. The two single-ended amplifiers 46 and 47, the switches $S_{12}$-$S_{14}$, $S_{16}$-$S_{17}$, and $S_{21}$-$S_{27}$, and the capacitors $C_3$-$C_8$ form the integrator 49 of the differential delta-sigma modulator 40.

Because of that the switches $S_{11}$-$S_{17}$ are closed and the switches $S_{21}$-$S_{27}$ are open in the $P_1$-period, two capacitors $C_3$ and $C_5$ samples respectively the output voltages of the two single-ended amplifiers 41 and 42 in the $P_1$-period as seen in FIG. 5a. In period $P_2$, the two capacitors $C_3$ and $C_5$ are connected by switches S26 and S27, which results in providing an average voltage of the two capacitors $C_3$ and $C_5$ charging a capacitor $C_4$ during the $P_2$-period. The average voltage represents the common mode voltage. The function of a switching capacitor charging another capacitor is equivalent to a low pass filter. The lowpass filtered common mode voltage is fed back to the inputs of the amplifiers 41 and 42 via two sampling capacitors $C_6$ and $C_7$ as seen in FIG. 5b.

Figure 5B:
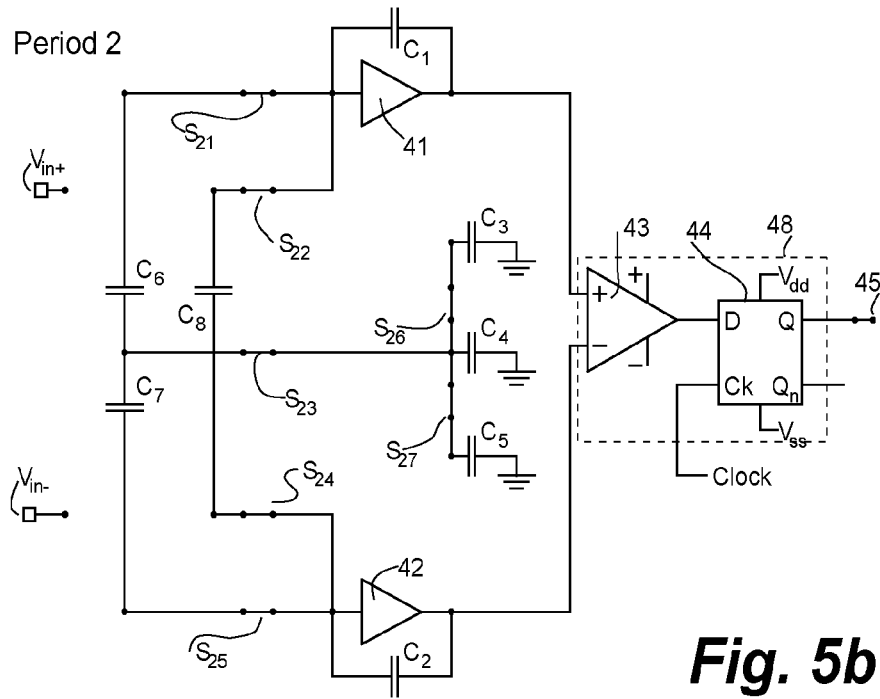

The signal present on the differential input, $V_{in+}$ and $V_{in-}$, is during the $P_1$-period sampled by a capacitor $C_8$ as seen in FIG. 5a and delivered as input to the two single-ended amplifiers 46 and 47 during the $P_2$-period as seen in FIG. 5b.

The proposed solution is extremely power efficient. The power of operating the plurality of switches $S_{11}$-$S_{17}$ and $S_{21}$-$S_{27}$ is practically negligible. Another significant advantage of the circuit is that the switch capacitor noise of the plurality of switches $S_{11}$-$S_{17}$ and $S_{21}$-$S_{27}$ only adds common mode noise but does not add to the differential noise, which is of importance for the performance of the differential delta-sigma modulator 40 using the two single-ended amplifiers 46 and 47. Common mode voltage gain approximates 1.

FIG. 4 illustrates a first order delta-sigma modulator 40 according to one embodiment of the invention and acting as an analog-to-digital converter. The differential integrator 49 has two inputs, one coming from the differential input, $V_{in+}$ and $V_{in-}$ of the delta-sigma modulator 40, the other is the feedback from the Flip-Flop 44 or the quantizer 48.

In order to control the common mode DC of the two single-ended amplifiers 46, 47 it is required to feed-back common mode via at least one of the two integrator inputs 30. The capacitor $C_8$ samples the differential input voltage received at the two integrator inputs 30 ($V_{in+}$ and $V_{in-}$). The differential input voltage has no reference to ground. The common mode feedback is entered via the sampling caps $C_6$ and $C_7$.

The inventive concept is generally applicable to any delta-sigma analog-to-digital converter. It is desired for most high high-performance converters to implement them differentially, why the power saving solution according to the invention where the integrator is implemented as simple, single-ended amplifiers is very attractive.

Compared to a single-ended configuration, the differential delta-sigma converter or modulator using simple, single-ended amplifiers in the integrator stage will increase dynamic range for same power usage and make the converter more tolerable to noise from other circuits on the same chip. The converter will also emit less noise to other circuits.

Figure 6:
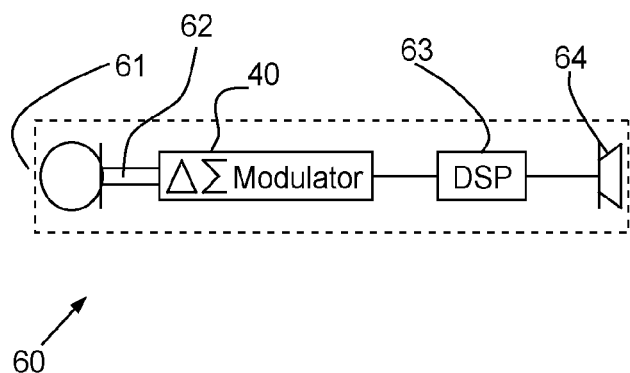
FIG. 6 shows an embodiment of the invention where the differential delta-sigma-modulator is included in a hearing assistive device.

In one embodiment of the invention shown in FIG. 6, the differential delta-sigma-modulator 40 according to the invention having an integrator 49 including a pair of single-ended amplifiers 46, 47, is included in a hearing assistive device 60, such as a hearing aid. The delta-sigma-modulator 40 receives a differential signal directly from a microphone 61 with a differential output 62. The delta-sigma-modulator 40 delivers an output signal to a digital signal processor (DSP) 63 for processing the digital signal so an audio signal output via a receiver or speaker 64 by the hearing assistive device 60 will be conditioned and amplified at frequencies in those parts of the audible frequency range where the user suffers a hearing deficit.

The invention claimed is:

1. A differential delta-sigma-modulator having an integrator including a pair of single-ended amplifiers and comprising:
   a sample clock driving a first switchable capacitor configuration and a second switchable capacitor configuration at a predetermined switching cycle;
   wherein the first switchable capacitor configuration is adapted for sampling respective outputs from the pair of single-ended amplifiers on a pair of output sampling capacitors in a first part of the switching cycle; and
   wherein the second switchable capacitor configuration is adapted for charging a common mode capacitor with the average voltage of the voltage sampled by the pair of output sampling capacitors in a second part of the switching cycle, wherein the voltage across the common mode capacitor represents the common mode voltage for the integrator;
   wherein a comparator is adapted for comparing the output from the pair of single-ended amplifiers and outputting a logical level in accordance to the comparison; and
   wherein the first switchable capacitor configuration in the first part of the switching cycle is adapted for sampling an output signal from the comparator by means of a pair of common mode feedback capacitors; and the second switchable capacitor configuration, in the second part of the switching cycle, is adapted for connecting the pair of common mode feedback capacitors to respective inputs of the pair of single-ended amplifiers.

2. The differential delta-sigma-modulator according to claim 1, wherein the second switchable capacitor configuration, during the second part of the switching cycle, comprises a feed-back path to respective inputs of the pair of single-ended amplifiers via the pair of common mode feedback capacitors.

3. The differential delta-sigma-modulator according to claim 1, wherein the first switchable capacitor configuration, during the first part of the switching cycle, is adapted for sampling input from a pair of differential input terminals by means of an input sampling capacitor; and wherein the second switchable capacitor configuration, during the second part of the switching cycle, is adapted for delivering the sampled input from the input sampling capacitor to respective inputs of the pair of single-ended amplifiers.

4. The differential delta-sigma-modulator according to claim 3 wherein the second switchable capacitor configuration, in the second part of the switching cycle, comprises a feed through path for the sampled input on the input sampling capacitor to respective inputs of the pair of single-ended amplifiers.

5. The differential delta-sigma-modulator according to claim 1 wherein sample clock driving of the first and second switchable capacitor configurations is adapted for providing a sampling cycle consisting of two non-overlapping periods.

6. A hearing assistive device having a microphone providing a differential output and a differential delta-sigma-modulator according to claim 1 for delivering an output signal for signal processing.

7. A method of operating a differential delta-sigma-modulator having an integrator including a pair of single-ended amplifiers and comprising:
   driving a first and a second switchable capacitor configuration at a predetermined switching cycle;
   sampling, in a first part of the switching cycle, respective outputs from the pair of single-ended amplifiers on a pair of output sampling capacitors;
   charging, in a second part of the switching cycle, the average voltage of the voltage sampled by the pair of output sampling capacitors on a common mode capacitor, wherein the voltage across the common mode capacitor represents the common mode voltage for the integrator;
   comparing the output from the pair of single-ended amplifiers and outputting a logical level in accordance to the comparison; and
   sampling an output signal from the comparator by means of a pair of common mode feedback capacitors in the first part of the switching cycle; and connecting the pair of common mode feedback capacitors to respective inputs of the pair of single-ended amplifiers in the second part of the switching cycle.

8. The method according to claim 7 and further comprising a feed-back path via the pair of common mode feedback capacitors to respective inputs of the pair of single-ended amplifiers in the second part of the switching cycle.

9. The method according to claim 7 and further comprising sampling in the first part of the switching cycle input from a pair of differential input terminals on an input sampling capacitor; and delivering the sampled input from the input sampling capacitor to respective inputs of the pair of single-ended amplifiers in the second part of the switching cycle.

10. The method according to claim 9 and further comprising providing a feed through path for the sampled input on the input sampling capacitor to respective inputs of the pair of single-ended amplifiers in the second part of the switching cycle.

11. The method according to claim 7 wherein the sampling cycle driving of the first and second switchable capacitor configurations is consisting of two non-overlapping periods.

12. A differential delta-sigma-modulator having two differential input terminals and further comprising:
   an integrator including a pair of single-ended amplifiers;
   a first switchable capacitor configuration provided between the two differential input terminals and the input of the pair of single-ended amplifiers;
   a second switchable capacitor configuration provided between inputs and outputs of respective pair of single-ended amplifiers; and
   a sample clock for driving the first switchable capacitor configuration and the second switchable capacitor configuration at a predetermined switching cycle;
   a comparator comparing the output from the pair of single-ended amplifiers and outputting a logical level in accordance to the comparison
   wherein a pair of common mode feedback capacitors in a first part of the switching cycle samples an output signal from the comparator, and wherein the first switchable capacitor configuration in a second part of the switching cycle connects the pair of common mode feedback capacitors to respective inputs of the pair of single-ended amplifiers.

13. The differential delta-sigma-modulator according to claim 12, wherein the second switchable capacitor configuration in the first part of the switching cycle samples the output from the pair of single-ended amplifiers by means of a pair of output sampling capacitors.

14. The differential delta-sigma-modulator according to claim 12, wherein the second switchable capacitor configuration in the second part of the switching cycle is adapted for charging a common mode capacitor charged by the average of the voltage sampled by the pair of output sampling capacitors, wherein the voltage across the common mode capacitor represents the common mode voltage for the integrator.

15. The differential delta-sigma-modulator according to claim 14, wherein the second switchable capacitor configuration in the second part of the switching cycle comprises a feed-back path via the pair of common mode feedback capacitors to a respective input of the pair of single-ended amplifiers.

16. The differential delta-sigma-modulator according to claim 12, wherein the first switchable capacitor configuration in the first part of the switching cycle samples input from the pair of differential input terminals by means of an input sampling capacitor.

17. The differential delta-sigma-modulator according to claim 16, wherein the first switchable capacitor configuration in the second part of the switching cycle provides a feed through path for the sampled input value on the input sampling capacitor to respective inputs of the pair of single-ended amplifiers.

18. The differential delta-sigma-modulator according to claim 12, wherein the sample clock provides a sampling cycle consisting of two non-overlapping periods.

19. A hearing assistive device having a microphone providing a differential output and a differential delta-sigma-modulator according to claim 12 for delivering an output signal for signal processing.

* * * * *